(12) United States Patent
Federley et al.

(10) Patent No.: US 10,310,008 B2
(45) Date of Patent: Jun. 4, 2019

(54) METHOD AND SYSTEM FOR TESTING AN ELECTRONIC UNIT

(71) Applicant: ENICS AG, Zürich (CH)

(72) Inventors: Kristian Federley, Sipoo (FI); Jukka Mattila, Hyvinkää (FI)

(73) Assignee: ENICS AG, Zurich (CH)

( * ) Notice: Subject to any disclaimer, the term of this patent is extended or adjusted under 35 U.S.C. 154(b) by 0 days.

(21) Appl. No.: 15/510,371

(22) PCT Filed: Sep. 9, 2015

(86) PCT No.: PCT/EP2015/070591
§ 371 (c)(1),
(2) Date: Mar. 10, 2017

(87) PCT Pub. No.: WO2016/038080
PCT Pub. Date: Mar. 17, 2016

(65) Prior Publication Data
US 2017/0261545 A1 Sep. 14, 2017

(30) Foreign Application Priority Data
Sep. 12, 2014 (FI) ...................................... 20145798

(51) Int. Cl.
*G01R 31/28* (2006.01)
*G01R 31/317* (2006.01)

(52) U.S. Cl.
CPC ..... *G01R 31/2834* (2013.01); *G01R 31/2839* (2013.01); *G01R 31/31703* (2013.01)

(58) Field of Classification Search
CPC .. G01R 31/2834; G01R 31/2836–2837; G01R 31/2839; G01R 31/2841; G01R 31/2846; G01R 31/2848; G01R 31/2851
See application file for complete search history.

(56) References Cited

U.S. PATENT DOCUMENTS 3,821,645 A 6/1974 Vinsani
3,976,864 A 8/1976 Gordon et al.
(Continued)

FOREIGN PATENT DOCUMENTS

EP 1514125 B1 8/2011

OTHER PUBLICATIONS

FI, Search Report, Finnish Patent Application No. 20145798, 2 pages, dated Apr. 27, 2015.
(Continued)

*Primary Examiner* — Toan M Le
(74) *Attorney, Agent, or Firm* — Thompson Hine LLP

(57) ABSTRACT

A method of testing an electronic unit by comparing resulting signal shapes from the unit to be tested and a known functioning unit. The method includes powering off the units for testing and feeding one or more predefined signal shapes of two or more different frequencies as input signals to the known functioning unit and to the unit to be tested at corresponding test points. The method further includes measuring the resulting signal shapes from both units at corresponding measurement points and comparing at least one resulting signal shape from the known functioning unit with the corresponding resulting signal shape from the unit to be tested. The method also includes detecting a fault in the unit to be tested on the basis of an existing signal shape distortion in time axis of the resulting signal shape received from the unit to be tested.

21 Claims, 16 Drawing Sheets

(56) References Cited

U.S. PATENT DOCUMENTS

| | | | |
|---|---|---|---|
| 4,139,147 | A | 2/1979 | Franke |
| 4,194,113 | A | 3/1980 | Fulks et al. |
| 4,271,515 | A | 6/1981 | Axtell, III et al. |
| 4,348,760 | A | 9/1982 | Rice et al. |
| 4,620,302 | A | 10/1986 | Binoeder et al. |
| 4,796,259 | A | 1/1989 | Troy |
| 4,835,774 | A | 5/1989 | Ooshima et al. |
| 5,592,077 | A | 1/1997 | Runas et al. |
| 6,324,665 | B1 | 11/2001 | Fay |
| 7,006,939 | B2 | 2/2006 | Voorakaranam et al. |
| 7,350,108 | B1 | 3/2008 | Dean et al. |
| 8,060,800 | B2 | 11/2011 | Goessel et al. |
| 2002/0093358 | A1 | 7/2002 | Kang |
| 2004/0150383 | A1 | 8/2004 | Blais |
| 2006/0242498 | A1* | 10/2006 | Hamilton ........... G01R 31/3167 714/724 |
| 2007/0290691 | A1* | 12/2007 | Vartiovaara ........ G01R 31/2837 324/520 |
| 2009/0307549 | A1 | 12/2009 | Choate et al. |

OTHER PUBLICATIONS

PCT, International Search Report, International Application No. PCT/EP2015/070591, 5 pages, dated Dec. 18, 2015.

PCT, Written Opinion of the International Searching Authority, International Application No. PCT/EP2015/070591, 6 pages, dated Dec. 18, 2015.

* cited by examiner

METHOD AND SYSTEM FOR TESTING AN ELECTRONIC UNIT

CROSS-REFERENCE TO RELATED APPLICATIONS

This application is a national phase entry of International Patent Application No. PCT/EP2015/070591 (International Publication No. WO 2016/038080) filed on Sep. 9, 2015, which in turn claims priority to Finland Patent Application No. 20145798, filed on Sep. 12, 2014. The entire contents of both applications are hereby incorporated by reference.

TECHNICAL FIELD

The disclosure is concerned with a method and system for testing an electronic unit as well as a computer program product used in the disclosed method and system and the use of the disclosed method and system.

BACKGROUND

Signature analysis is a method of determining the location and/or nature of a fault in an analog or digital system, like a component or a circuit, by input of test sequences and inspection and measurement of the resulting output sequences called signatures.

Several options are available for testing the analog and digital systems, and the measurement of the signatures can e.g. be made by digitizers and oscilloscopes. An oscilloscope is a digitizer with a screen for presenting an image of the measured signature on a display.

Digitizing or digitization is the representation of an object, image, sound, document or a signal (usually an analog signal) by a discrete set of its points or samples. The result is called digital representation or, more specifically, a digital image for the object and a digital form for the signal.

Digitizing can simply mean capturing an analog signal in digital form. A digitizer samples a waveform and transforms it into discrete values with an analog input path and with an Analog-to-Digital Converter (ADC). A digitizer can e.g. transform a measured voltage in digital form.

With a digitizer, standard oscilloscope measurements, like voltage, current, time and frequency, can be performed. Oscilloscopes can see the waveforms present at various points of a circuit and are excellent for looking at waveforms, and waveform shapes, which are shown on a display of a screen.

An oscilloscope allows observation of constantly varying signal voltages, usually as a two-dimensional plot of one or more signals as a function of time. Non-electrical signals (such as sound or vibration) can be converted to voltages and displayed. Oscilloscopes are used to observe the change of an electrical signal over time, such that voltage and time describe a shape which is continuously graphed against a calibrated scale. The observed waveform can be analyzed for such properties as amplitude, frequency, rise time, time interval, distortion and others. Modern digital instruments may calculate and display these properties directly.

An oscilloscope measures voltage on a momentary basis and can also present the value of the voltage and how it has changed in time, i.e. historically. From this history, it can be seen if the change is repeated and if so, how often. The interval of the changes constitute the frequency of the voltage and can be directly calculated by software in the oscilloscopes by measuring the time between the repetitions.

Analog Signature Analog signature analysis is an electronic component and circuit board troubleshooting technique which applies a current-limited Alternating Current (AC) across two points of an electronic component or circuit and the Analysis relies on a change in electrical characteristics to detect problems on a circuit board. The resulting current/voltage waveform is shown on a signature display using vertical deflection for current and horizontal deflection for voltage. This unique analog signature represents the overall health of the part being analyzed. By comparing the signatures of known good circuit boards to those of suspect boards, faulty nets and components can be quickly identified.

The usual waveform of an AC power circuit is a sine wave, but also other waveforms can be used in certain applications, such as triangular or square waves.

A waveform is the shape and form of a signal such as a wave moving in a physical medium or an abstract representation. In many cases, the medium in which the wave is being propagated does not permit a direct visual image of the form. In these cases, the term 'waveform' refers to the shape of a graph of the varying quantity against time or distance. An oscilloscope can be used to pictorially represent a wave as a repeating image on a display of a screen. By extension, the term 'waveform' also describes the shape of the graph of any varying quantity against time.

A square wave is a non-sinusoidal periodic waveform (which can be represented as an infinite summation of sinusoidal waves), in which the amplitude alternates at a steady frequency between fixed minimum and maximum values, with the same duration at minimum and maximum. The transition between minimum to maximum is instantaneous for an ideal square wave, which, however, is not realizable in physical systems. Square waves are often encountered in electronics and signal processing. Its stochastic counterpart is a two-state trajectory. A similar but not necessarily symmetrical wave, with arbitrary durations at minimum and maximum, is called a rectangular wave (of which the square wave is a special case).

A triangle wave is a non-sinusoidal waveform named for its triangular shape. It is a periodic, piecewise linear, continuous real function. Like a square wave, the triangle wave contains only odd harmonics, due to its odd symmetry. However, the higher harmonics roll off much faster than in a square wave (proportional to the inverse square of the harmonic number as opposed to just the inverse).

In this connection it is mentioned that Peak-to-peak voltage, Vpp, is a voltage waveform which is measured from the top of the waveform, called the crest, all the way down to the bottom of the waveform, called the trough. So peak-to-peak voltage is just the full vertical length of a voltage waveform from the very top to the very bottom. A peak-to-peak voltage is encountered in many environments. A voltage should not be assumed to be a peak-to-peak unless directly specified as that. For example, the voltage should say at the end, Vpp. For example, 60 Vpp. There is another type of voltage called the peak voltage. Sometimes peak voltage and peak-to-peak voltage are confused with each other. The peak voltage is exactly half of the peak-to-peak voltage waveform if it is symmetric with respect to the zero level, i.e. the signal has no direct voltage component.

Analog Signature Analysis relies on a change in electrical characteristics of the electronic component or circuit board to detect problems in them. The change is between the input test sequence and the resulting output sequence called signature. This resulting analog signature is unique for each particular type of a well working ("good" or "healthy")

component, like e.g. a resistor, capacitor or diode, known to be functioning. Any deviation from the normal signature strongly suggests the existence of a fault in that component.

The resulting signature is presented as a current/voltage waveform shown on a signature display using vertical deflection for current and horizontal deflection for voltage. This unique analog signature represents the overall health of the part being analyzed. By comparing the signatures of known good circuit boards to those of suspect boards, faulty nets and components can be quickly identified.

Power-off testing is often necessary in testing electronic components due to uncertainty as to the nature of the failure. When the electronic components can be further damaged by applying power it is necessary to use power off test techniques to safely examine it.

In analog circuit testing, a circuit can be characterized by various voltage levels or current levels at certain test points or, in the case of digital signature testing, also by the frequencies of certain signals at those test points.

Voltage or current level measurement is also used in connection with digital circuits to determine that the circuit is at least operating in some manner. In most situations, in which digital circuits are being tested, digital signals are available at various points in the circuit, which indicate the operation of the circuit.

In existing methods for testing of digital logic boards, a test sequence can be generated that will exercise the logic circuitry on a board under test and compare, at each node of the logic circuitry of the board under test, the response of the board under test with the corresponding node response of a known good board. The known correct responses are stored in a memory and fetched therefrom for comparison of the measured node responses of the board under test. The resulting signal response is individual for each node and test point and is measured on both sides of the test point.

SUMMARY

An object of the invention is to determine faults in both analog and digital circuits.

A more detailed object is to provide a user friendly measuring device that identifies faults in electronic units by assigning its own signature of the electrical component.

A still further detailed object is a user friendly measuring device that identifies faults in a circuit board in its whole, not only individually for each node.

In one case a method of the invention for testing an electronic unit is performed by feeding one or more pre-defined signal shapes as input signals to a known functioning unit and to a unit to be tested at corresponding test points. The resulting signal shapes are measured from both units at corresponding measurement points. At least one resulting signal shape from the good unit is then compared with the corresponding resulting signal shape from the unit to be tested. A fault in the unit to be tested is detected on the basis of an existing signal shape distortion in time axis of the resulting signal shape received from the unit to be tested.

In one case the system of the invention for testing an electronic unit comprises at least one electronic functioning unit, at least one electronic unit under test being comprised in the system simultaneously or interchangeably with the electronic functioning unit, a signal generator and a measurement instrument both connectable to the electronic units. The signal generator has means for creating one or more signals with pre-defined signal shapes and for feeding the created signals as input signals to the electronic functioning unit simultaneously or separately to the electronic unit under test. The measurement instrument has means for receiving at least one resulting signal shape simultaneously or separately from the electronic functioning unit and from the electronic unit under test, for transforming the at least one resulting signal shape into discrete values that describe the signal shape, and for presenting information of the at least one resulting signal shape.

In one case the computer program product of the invention takes the form of a machine readable media in a non-transitory form and executes method steps when run in computer readable media in a system comprising at least one electronic functioning unit, at least one electronic unit under test, a signal generator connectable to the electronic units, and a measurement instrument connectable to the electronic units, the electronic units being connected simultaneously or interchangeably to a measurement instrument. The method steps comprises comparing at least one resulting signal shape from the functioning unit with the corresponding resulting signal shape from the unit to be tested, and detecting a fault in the unit to be tested on the basis of an existing signal shape distortion of the resulting signal shape received from the unit to be tested.

In one case the method of the invention is used for electronics production testing, fault identification in electronics repair, component testing in manufacturing and repair, or counterfeit component identification.

In one case the signal generator has means for creating signals of varying frequencies and for creating different waveforms and the method is performed for two or more different frequencies on the input signals, in one case over a frequency range with a waveform of the input signal that is a positive square form, a triangle wave form, or an arbitrary wave form, such as square or triangle waveforms.

The input signal and the measurement can be fed to one or more corresponding test points and measurement points, respectively on both units or vice versa.

The resulting signal shapes from both units can be measured as the voltage variation in time.

In a first embodiment, the testing is performed by feeding the input signals simultaneously to and measuring the resulting signal shapes simultaneously from the known functioning unit and to the unit under test, whereby the comparison is performed constantly during the testing and in a second embodiment, the testing is performed by feeding the input signals in two separate phases to the known functioning unit and to the unit under test and In the second embodiment, the measured signal shape from each measurement point from the functioning unit is stored as a reference shape to constitute the signal signature of the functioning unit and correspondingly the measured signal shape from each measurement point from the unit under test is stored as a resulting signal shape to constitute the signal signature of the unit under test. In the first embodiment, storing of the signals is not necessary but can be done if desired. The signal signatures are stored as functions of the voltage variation in time of the feed-back signals.

The system can further comprise a memory database and a processing unit in the measurement instrument for storing the resulting signal shapes in the memory database and for fetching data of resulting signal shapes from the electronic units from the database for the comparison.

The comparison of step can be performed automatically by software calculation or by manual image analysis.

In one case the system further comprises a memory database and a processing unit in the measurement instrument for storing the resulting signal shapes in the memory database and for fetching data of resulting signal shapes from the electronic units from the database for the comparison.

In one case the data processing unit in the measurement instrument has software for comparing at least one resulting signal shape from the functioning unit with the corresponding resulting signal shape from the unit to be tested, and for detecting a fault in the unit to be tested on the basis of an existing signal shape distortion of the resulting signal shape received from the unit to be tested. The comparison is performed by the software further with an algorithm for the fault detection that compares resulting signal shapes from an electronic unit under test and an electronic functioning unit and analyzes the difference to detect said signal shape distortion.

In one case the measurement instrument is connected to or comprises a display being an oscilloscope in the latter case and a digitizer in the former case. The software presents information of the resulting signal shapes of both units simultaneously or separately on the display of the measuring instrument. The signal signatures can be presented simultaneously or separately on a user interface as graphs with the voltage as the y-axis and the time as the x-axis.

In one case, electronic unit functionality is examined with its AC signal response. Unit interfaces, such as different connectors, are fed with AC voltage with varying frequencies and the signal shape and resulting current variation are measured.

In one case a frequency sweep between a low minimum value and a high maximum value is used. In practice, a positive square wave of 1 Vpp in the range of 10 Hz-1 MHz is typically used as attest signal. Vpp is a measurement of the size (amplitude or volume) of an electronic signal's wave from the highest point of the wave to the lowest point.

In one case testing the frequency response of each product is determined over the frequency range. The response is dependent on product circuit topology and component values. Changes in those vary the frequency response at change related frequencies.

In one case testing, the measurement points are selected at desired positions within the circuit board for fault detection and the fault can be checked for a given place in the unit.

In one case, when a fault has been detected, it can be localized by comparing the waveform at each measurement point at the frequency which the unit produces.

In one case measured signatures from a unit under test and a known good unit are compared to each other during the frequency sweep to identify faulty units, like circuits or components. Initial measurements are done at a given number of test points and measurement points and should problems be found, new test points and measure points can be added to identify exact fault location.

In this text, the positions to which the input signals are fed for testing are called test point. The test points can e.g. be at connectors. The measurement points can be anywhere in the circuit at a distance from the test points. Often the measurements are performed over resistors.

In one case current or voltage variation in relation to input signal variation forms an AC signal signature for the interface. In case there are faults on the measured unit, its electrical characteristics change compared to a good well working unit and create a change in the AC signal signature.

In one case the testing is performed with the units powered off.

In one case the signature testing method of the invention can be applied to both analog and digital electronic units and components. The electronic unit is an individual component or a circuit board.

In one case the method comprises the steps of:
feeding a known signal waveform over a frequency range into a known good unit and to a unit to be tested and measuring the resulting signal shape from several measure points in both units,
comparing the resulting waveform against a known good waveform to identify a fault in the unit to be tested, in one case with automatic or manual image analysis,
evaluating the result on the basis of signal shape distortion in time axis. (i.e. it is not a V/I curve but a V/t curve).

In prior systems, the voltage in the input signal is often varied. Therefore, unit specific signals are typically needed in the testing when using prior methods since the voltage can vary between nodes in the instrument.

In one case the voltage in the input signal is not varied, and the method does not require unit specific signals and therefore any detailed unit examination is not needed but a known signal waveform over a frequency range can be used. The measurement of the resulting signal shapes is, however, done with the power of the units off.

In one case the resulting voltage/time curve is shown on a signature display using vertical deflection for voltage and horizontal presentation for time as opposed to the solutions of existing systems, wherein a current/voltage waveform is often used.

In prior systems, a certain frequency is typically used in the input signal to the electronic unit to be tested and the feedback signature is an individual image, by varying the voltage of the voltage/current ratio.

In the current system, the voltage can constantly be kept low since it is the frequencies and shapes of the fed input signal that vary. This provides an advantage, since it results in a considerably reduced risk for unit damages during testing.

The disclosed system and method will allow users to identify and verify electronic components without requiring any knowledge of the electronic component in which the testing is performed and the circuit board as a whole can be tested without the need to test the circuit node by node as in many prior systems, wherein knowledge about how the current varies between the individual components in the board is necessary. Hence, determination of the status of an electronic component is quick, accurate and user-friendly.

The disclosed system and methods are therefore successful for testing circuit boards but can equally well be used for individual components as well, whereas prior systems using signature analysis are in the first hand often suitable for testing individual components or circuit boards component by component.

The disclosed system and method have several application areas:

Electronics Production Testing

The signal signature analysis method can be used in electronics production testing to identify faulty units. The disclosed method eliminates the need to examine the functionality of the unit to be tested. As AC signal signature analysis is based on comparing waveforms from various test points, if is not necessary to know the functionality of the unit to be tested.

Fault Identification in Electronics Repair

In prior systems, defining whether a product is faulty or not is typically a major time consuming element within professional electronics repair services. The use of AC signatures in the disclosed way provides a fast way to verify functionality. The method can also be used to verify repair success.

Component Testing in Manufacturing and in Repair

The disclosed system and method also enables recording and verification of signatures for individual components in a similar fashion as for complete units.

Counterfeit Component Identification

Electrical characteristics of counterfeit components differ to those of genuine ones as they are made for different specifications or by using a different manufacturing process. As there are differences in electrical characteristics, there are also differences in their signal signatures. These differences can be used to identify a counterfeit component. Counterfeit electronic components are electronic parts that are misrepresented as to their origins or quality. Counterfeiting of electronic components can be an infringement of the legitimate producer's trademark or other rights. Since counterfeit parts often have inferior specifications and quality, they may represent a hazard if incorporated into critical systems such as aircraft navigation, life support, military equipment, or space vehicles. The marketing of electronic components has been commoditized, making it easier for the counterfeiter to introduce substandard and counterfeit devices into the supply chain.

In one case the input waveform does not need to be customized for testing a specific product.

In the following, the system and method will be described by means of some embodiments by means of figures, to which the invention is not restricted.

DETAILED DESCRIPTION

Figure 1:
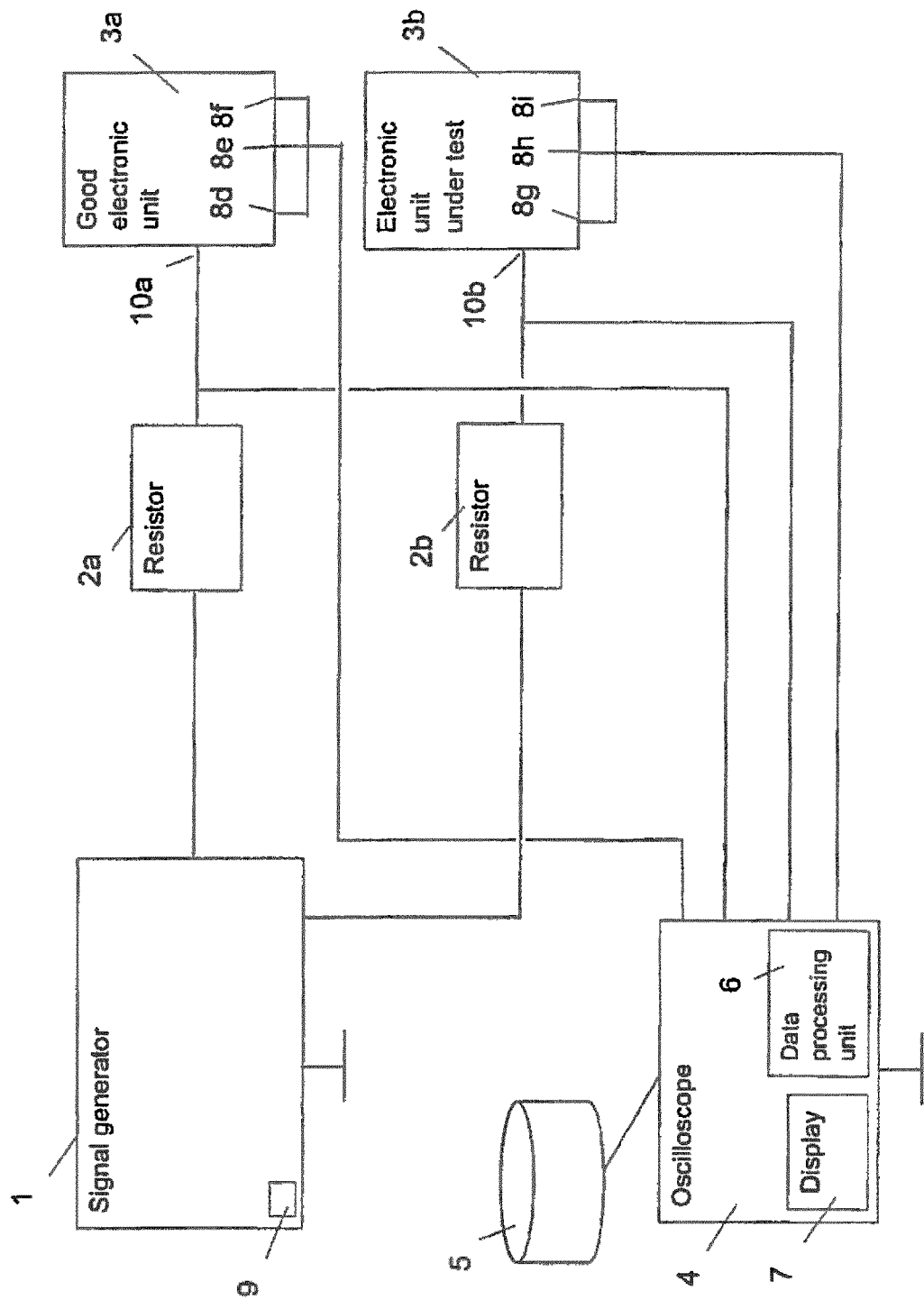
FIG. 1 is a general architecture view of a first embodiment of the disclosed test system.

FIG. 1 is a general architecture view of a test setup used in a first embodiment of the disclosed system. It comprises a signal generator 1, two current limiting resistors 2a and 2b, a measuring instrument 4, such as an oscilloscope, and two corresponding electronic units 3a and 3b connected to the signal generator 1 and to the measuring instrument 4. Electronic unit 3a is in FIG. 1 known to be a good, well-functioning (i.e. working) unit and electronic unit 3b is an actual unit under test connected for fault detection in the disclosed system and is identical with unit 3a in case of no failure. An optional memory database 5 is in connection with the measuring instrument 4.

The current limiting resistors 2a and 2b implement electrical resistance in the circuit element and reduce and adjust current flow, and, at the same time, act to lower and adjust the voltage levels within the circuit. They are fixed and selected so that the current resulting from the input signal does not cause damage to the electronic units 3a and 3b. When e.g. modern digital units are tested, a value of e.g. 1 kΩ is suitable.

The signal generator 1 creates different signals of varying frequencies and waveforms and has means for feeding a predefined wave form of a given frequency range to the electronic units 3a and 3b. In the embodiment of FIG. 1, the input feed is to connector 10a in the known good unit 3a and to connector 10b of the unit under test 3b. The connectors constitute the test points in this case, but the input signals could equally well be fed to other places in the electronic units 3a and 3b.

The fed waveform range constitutes the input signals (input feed) in the current method. The signal generator is capable of producing an arbitrary waveform in the range of 1 Hz to 10 MHz where the waveform does not extend to negative voltages.

The signals of varying frequencies and waveforms created and fed by the signal generator 1 propagate in the embodiment of FIG. 1 throughout both the electronic units 3a and 3b. The test is initiated by activating a switch 9, whereby the signal waveform is fed to the electronic units 3a and 3b.

The digital signatures both from the good unit and the actual unit under test are recorded from corresponding measurement points 8d-8f, 8g-8i (8d-8f from the known good unit and 8d-8f from the unit under test) and across the current limiting resistors of the corresponding unit. They can be stored in a memory database 5 but in this embodiment are not needed to.

In this first embodiment, the measuring instrument is in one case an oscilloscope and has a bandwidth of 10 MHz for capturing the measured resulting signal and the resulting measured signal shapes constitute the digital signature of the unit. Optionally, the measuring instrument can have an ability to store the measured signal in a digital format.

The test signal could instead e.g. be fed to the test points 10a and 10b and be measured from the connectors 8d, 8e, 8f and 8g, 8h, 8i, respectively or various other test points and measurements points could be used. The selection is made case by case and the measurements are performed in each case from points on other places than the test points, i.e. places of the input feed.

A data processing unit 6 in the measuring instrument 4 receives the data corresponding to the feedback signal shapes via a digitizer in it from each measuring point 8d, 8e, 8f and 8g, 8h, 8i, i.e. both from the known good unit and from the actual unit to be tested. The digitizer of the measuring instrument 4 captures the analog signals from both units and samples a waveform and transforms it into discrete values that describe the signal shape that represent the signatures.

The values from the various measurement points 8d, 8e, 8f and 8g, 8h, 8i of the units can be presented in image form on a display 7 of the screen of the oscilloscope constituting the measurement instrument 4. For that purpose, the data processing unit 6 executes functions upon the data to generate a code that is provided to the display 7 to show images of the feedback signal shapes showing the waveforms of the signatures.

The values from the measurement point 8g, 8h, 8i of the unit to be tested are compared to those of the corresponding measurement point 8d, 8e, 8f of the known good unit throughout the signal frequency range. Differences in values indicate a fault since the units 3a and 3b are similar units.

In a certain embodiment, the data processing unit 6 can compare the digital signatures from the known good unit 3a and the unit under test 3b with image comparison software. The comparison can also be performed manually with human observation by studying the images on the display.

If the comparison is performed by human observation, a display for the signal presentation can be provided. An oscilloscope has such a display inbuilt, but if the measuring instrument consists of a digitizer only, the signal from the digitizer can also be visualized by connecting it to some display apparatus, typically a Personal Computer (PC).

One further way to perform the comparison is by machine made image processing. Hereby, the measured signals are fed to the PC and compared therein. The signals can be fed from a digitizer or an oscilloscope.

A still further way to perform the comparison is by calculation from the digitized data of the measured signal by software, whereby no display is needed.

With an oscilloscope, the result is received as the (varying) value of the voltage over time, i.e. the signal form. Hereby, the voltage of the signal across the current limiting resistors 2a and 2b is measured with the measuring instrument 4 to generate a graph with the voltage as the x-axis and the time as the y-axis constituting the image.

By knowing the value of the resistance RL, the current can be calculated by means of Ohm's law and thereby the current can be indirectly measured.

It is also possible to connect detectors to the oscilloscope and directly measure the current or the temperature or other quantities, in which case the quantity measured, however, is transferred to voltage. When the current is directly measured, the resistor RL is inside the detector.

Figure 2:
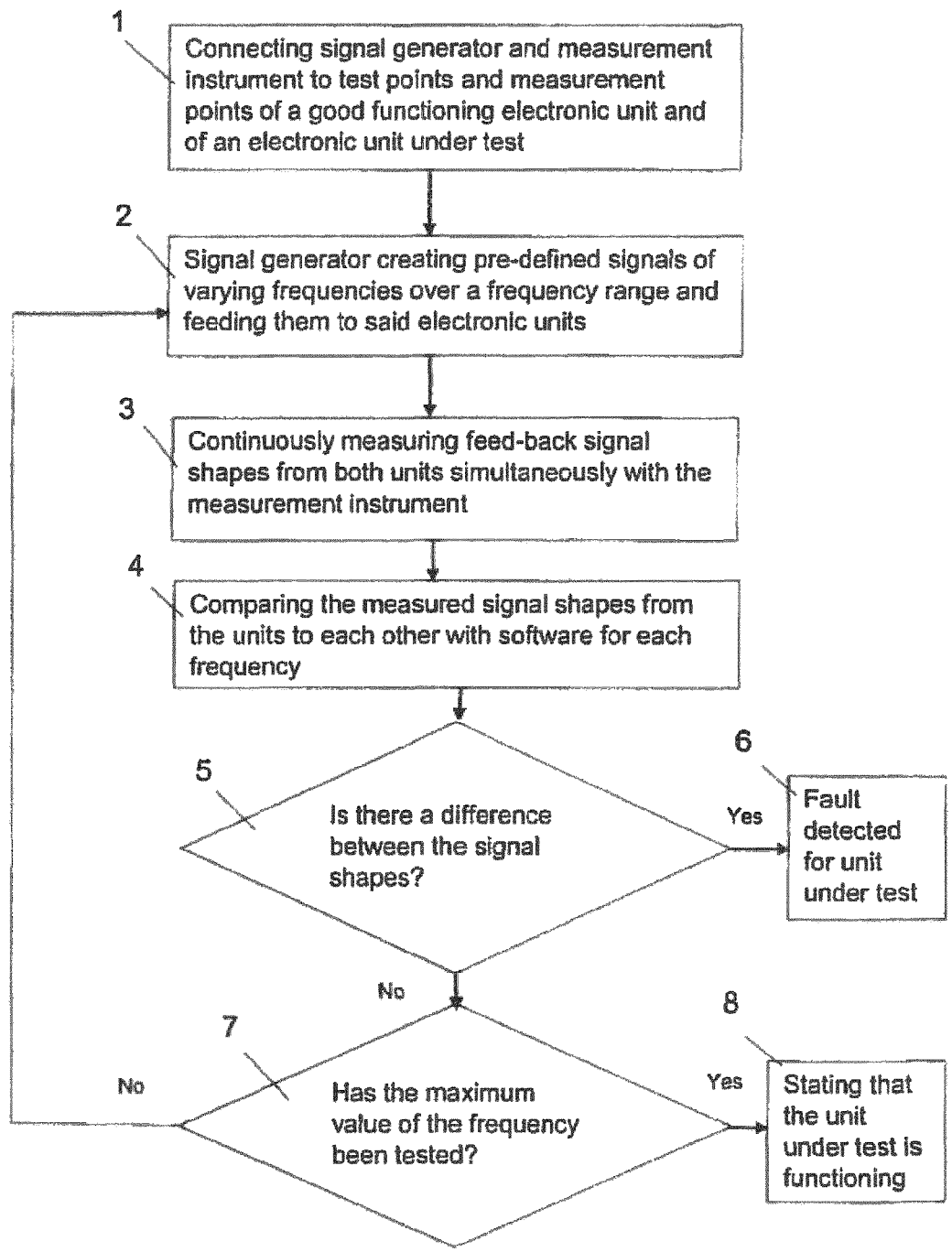
FIG. 2 is a flow scheme of a first embodiment of the disclosed method as implemented in a system of FIG. 1.

FIG. 2 shows a flow chart of a first embodiment of the disclosed method as implemented in a system of FIG. 1.

The method starts with a connecting step 1, in which the signal generator is connected to the interfaces of an electronic unit 3a that is known to work well and also those of an electronic unit under test 3b, the interface constituting test points. Also a measurement instrument 4 is connected to the same electronic units at places constituting the positions of measurement points (other than the test points).

In step 2, the signal generator creates signals of varying frequencies over a certain frequency range (varying from a minimum value to a maximum value) with a selected waveform, such as a square wave or triangle wave. The signals constitute a test sequence with the varying frequencies and they are executed from the signal generator and fed to both the good unit 3a and the unit under test 3b.

The signal shape is continuously detected by the data processing unit 6 in step 3 from the measurement points of the units. In this way, signal signatures of both the known good unit and the unit under test are created.

Figure 4:
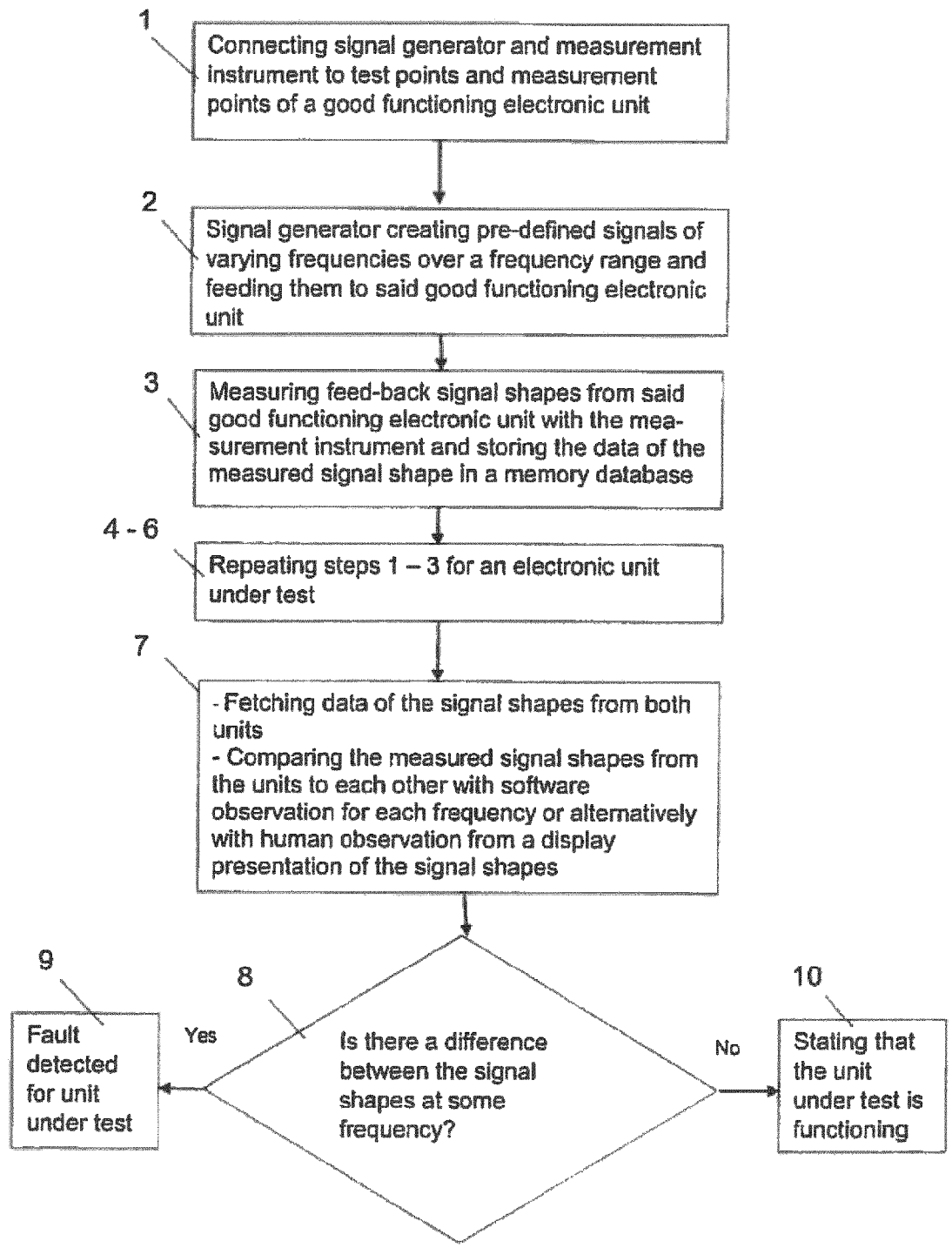
FIG. 4 is a flow scheme of a second embodiment of the disclosed method implemented in a system of FIG. 3.

In step 4 of FIG. 4, the digital signatures from the known good unit and the unit under test are compared for each frequency fed with image comparison software for one frequency at a time.

Alternatively or optionally, the digital signatures are continuously displayed on the screen for human observation and comparison. The signal shapes are analyzed for differences in order to identify a fault in the unit to be tested on the basis of signal shape distortion in time axis of the resulting signal shape from the unit to be tested.

If there is a difference between the signal shapes from the known good unit and from the unit under test, which is stated in step 5, a fault is detected for the unit to be tested in step 6.

If the signal shapes from the known good unit and from the unit under test correspond to each other for the actual frequency and no difference can be detected, which is stated in step 5, the unit to be tested is considered to work in step 8 if the maximum value of the frequency has been reached, i.e. when the waveforms have been compared for all frequencies within the frequency range to be tested.

If the maximum value has not yet been received, which is stated in step 7, steps 2-5 are repeated until all frequencies have been tested for, i.e. the maximum value of the frequency has been reached.

Figure 3:
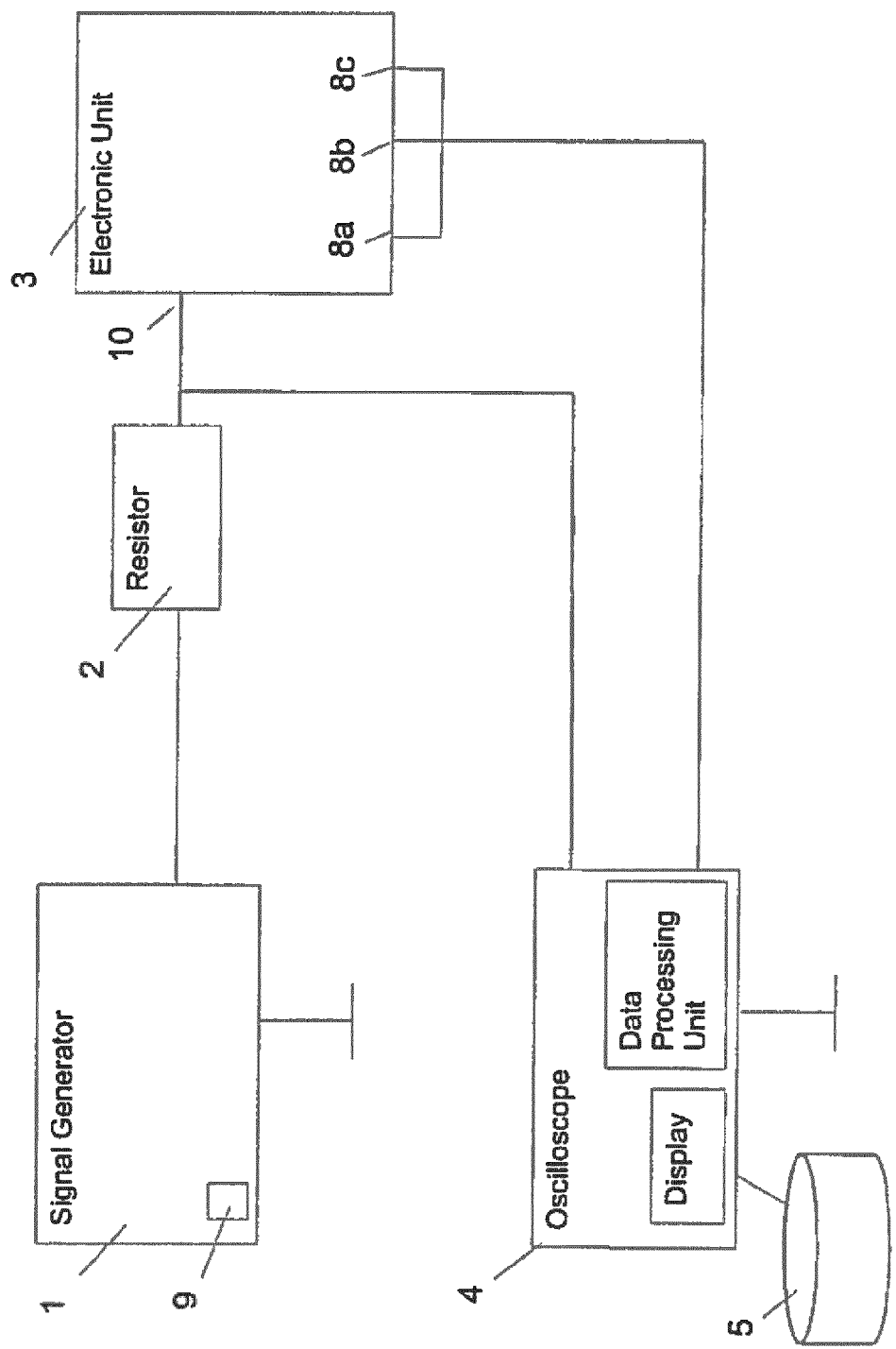
FIG. 3 is a general architecture view of a second embodiment of the disclosed test system.

FIG. 3 is a general architecture view of a test setup used in a second embodiment of the disclosed system. It comprises a signal generator 1, a current limiting resistor 2, a measuring instrument 4, such as an oscilloscope, an electronic unit 3 connected to the signal generator 1 and to the measuring instrument 4. A memory database 5 is in connection with the measuring instrument 4. Reference number 3 means that the electronic unit either can be a known good, well-functioning unit 3a or the actual unit under test 3b being in the second embodiment interchangeably connected to the disclosed system. Reference number 2 means that the resistor either can be the resistor 2a of the functioning unit 3a or the resistor 2b of the unit under test 3b.

In the first phase of this second embodiment of the disclosed method, a known good, well-functioning unit 3a is connected to constitute the electronic unit 3. The actual unit under test 3b is connected for fault detection in the second phase of the second embodiment of the disclosed method thereby replacing the good unit 3a in the system of FIG. 3. The good unit and the unit under test, naturally, have to be corresponding devices so that the measuring results would be comparable.

The signal generator 1 creates different signals of varying frequencies and waveforms and has means for feeding a predefined wave form of a given frequency range to the electronic unit 3, i.e. either unit 3a or 3b, depending on which unit is tested. In the embodiment of FIG. 3, the input feed is to connector 10 constituting a test point, but could equally well be fed to other places in the electronic unit 3. Reference numbers 8a, 8b, 8c means that the measure points either can be the measurement points 8d, 8e, 8f of the known good, well-functioning unit 3a or they can be the measurement points 8g, 8h, 8i of the actual unit under test 3b being in the second embodiment interchangeably connected to the disclosed system.

The signals fed propagate throughout the electronic unit 3. The test is initiated by activating a switch 9, whereby the set of pre-defined signals is fed to the electronic unit 3.

The measuring instrument 4, which like that of FIG. 1, can be a digitizer or an oscilloscope (i.e. a digitizer with a screen for display), has means to connect to one or more measurement points 8 and for receiving feedback signal shapes from these measurement points 8, i.e. either measurement points 8d, 8e, 8f or 8g, 8h, 8i, depending on which unit 3a or 3b is tested.

As was the case in FIG. 1, the test signal could instead be fed to the measurement points 10 and be measured from the connectors 8a, 8b, 8c or from various other test points or vice versa or alternatively, only connectors or only test points can be used.

The digital signatures both from the good unit and the actual unit under test are recorded from the same measurement point and stored in a memory database 5.

A data processing unit 6, in the measuring instrument 4 receives the data corresponding to the feedback signal shapes via the digitizer from each measuring point both from the known good unit in the first phase of the second embodiment of the disclosed method and from the actual unit to be tested in the second phase of the second embodiment of the disclosed method. The digitizer captures the analog signals from both units, samples a waveform, and transforms it into discrete values that describe the signal shape that represent the signatures.

The values from the various measurement points can be presented in image form on a display 7 of the screen of the oscilloscope of the measurement instrument 4. For that purpose, the data processing unit 6 executes functions upon the data to generate a code that is provided to the display 7 of the screen of the oscilloscope of the measurement instrument 4 to show images of the feedback signal shapes showing the waveforms of the signatures.

The values from each measurement point of the unit to be tested are compared to those of the same measurement point of the known good unit throughout the signal frequency range with the methods indicated above in connection with FIG. 1. Differences in values indicate a fault.

FIG. 4 shows a flow chart of the second embodiment of the disclosed method as implemented in a system of FIG. 3.

The method starts with a connecting step 1, in which the signal generator is connected to connectors of an electronic unit that is known to work well, the connectors constituting test points. Also a measurement instrument is connected to the same good electronic unit via places constituting the positions of measurement points.

In step 2, the signal generator 1 creates signals of varying frequencies over a certain frequency range (varying from a minimum value to a maximum value) with a current that varies in accordance to a selected waveform, such as a square wave or triangle wave. The signals constitute a pre-programmed or a pre-set test sequence with the varying frequencies and it is executed from the signal generator and fed to the good unit.

Data is received by the data processing unit 6 of the measuring instrument 4 in step 3 and the signal shape is detected from each measurement point on the basis of how the voltage varies and the resulting signal shape is stored in the memory database as a reference shape. Thereby, the signal signature of a known good unit has been created and stored in the database and the good electronic unit can now be disconnected.

In step 4, the signal generator as well as the measurement instrument are connected to the connectors of an electronic unit to be tested for fault detection to replace the known good unit at the same interfaces (connectors constituting the test points with respect to the signal generator and measurement points with respect to the measurement instrument) as were done for the known good unit in step 1.

In step 5, the signal generator creates the same signals as in step 2. The pre-programmed or pre-set test sequence is executed from the signal generator and fed to the unit under test.

In step 6, data of feedback voltage is again received by the data processing unit as in step 3 and the signal shape is detected from each measurement point on the basis of how the voltage varies and the resulting signal shape is stored in the memory database as a signal shape to be compared with the reference shape stored in step 3. Thereby, the signal signature of the unit under test has been created and stored in the database.

In step 7, the data processing unit fetches image data information of both signatures from the memory database and compare the digital signatures from the known good unit and the unit under test with software and optionally or alternatively execute functions to generate a code for the display of the screen for image presentation of the resulting signal shapes from the known good unit as well as from the unit under test for human observation. The difference of these signal shapes are analyzed in order to identify a fault in the unit to be tested on the basis of a signal shape distortion in time axis of the resulting signal shape from the unit to be tested.

If there is a difference between the signal shapes from the known good unit and from the unit under test, which is stated in step 8, a fault is detected for the unit to be tested in step 9.

If the signal shapes from the known good unit and from the unit under test correspond to each other and no difference can be detected, which is stated in step 8, the unit to be tested is considered to work in step 10.

The memory database might contain several reference signatures from different known good and functioning units. From these reference signatures the user can identify the correct corresponding unit or component to be compared from a known list of the functioning units or components and quickly determine if the tested unit or component is functional or non-functional. The disclosed method is especially useful for testing units with several circuit boards, but can equally well be used for testing e.g. relays, diodes, thyristors, cables and connectors.

In a certain embodiment, the data processing unit 6 can compare the digital signatures from the known good unit and the unit under test with image comparison software. The comparison can also be performed manually with human observation by studying the images on the display.

If the comparison is performed by human observation, a display for the signal presentation is necessary. An oscilloscope has such a display inbuilt, but the signal from the digitizer can also be visualized by connecting it to some display apparatus, typically a Personal Computer (PC).

A still further way to perform the comparison is by calculation from the digitized data of the measured signal by software, whereby no display is needed.

EXAMPLES

Figure 5A:
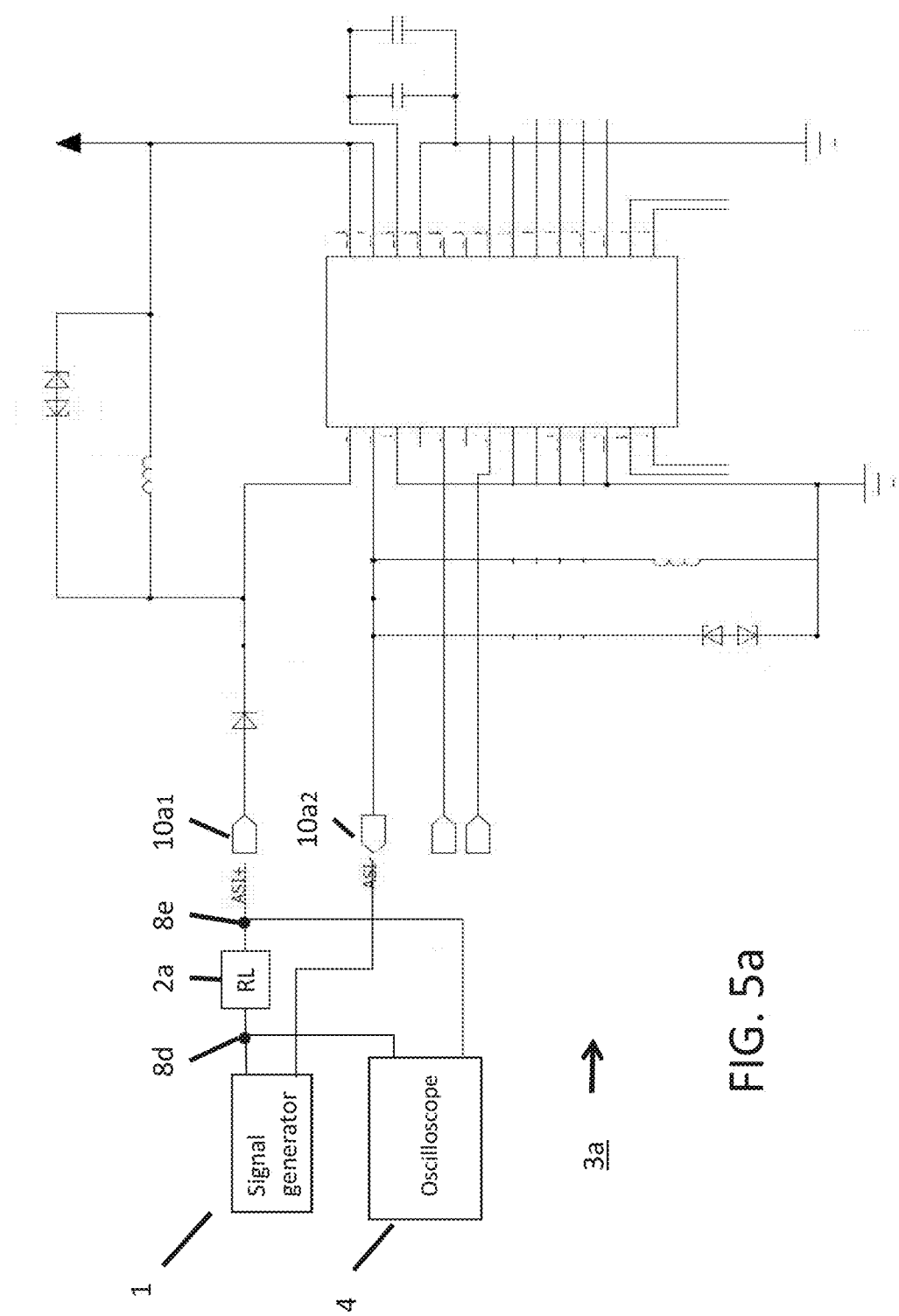
FIG. 5a illustrates the disclosed method implemented for testing a power supply section of a good control unit.

FIG. 5a illustrates the method implemented for testing a power supply section of a control unit to be tested. This power supply section of a good control unit $3a$ is known to work well. For testing in accordance with the disclosed method, the signal generator 1 is connected to the good unit at connectors $10a_1$, $10a_2$ via which an input signal is introduced. An oscilloscope 4 is connected to a measurement points $8d$, $8e$ for measuring the feedback signal produced by the unit $3a$ as a result of the input signal.

Figure 5B:
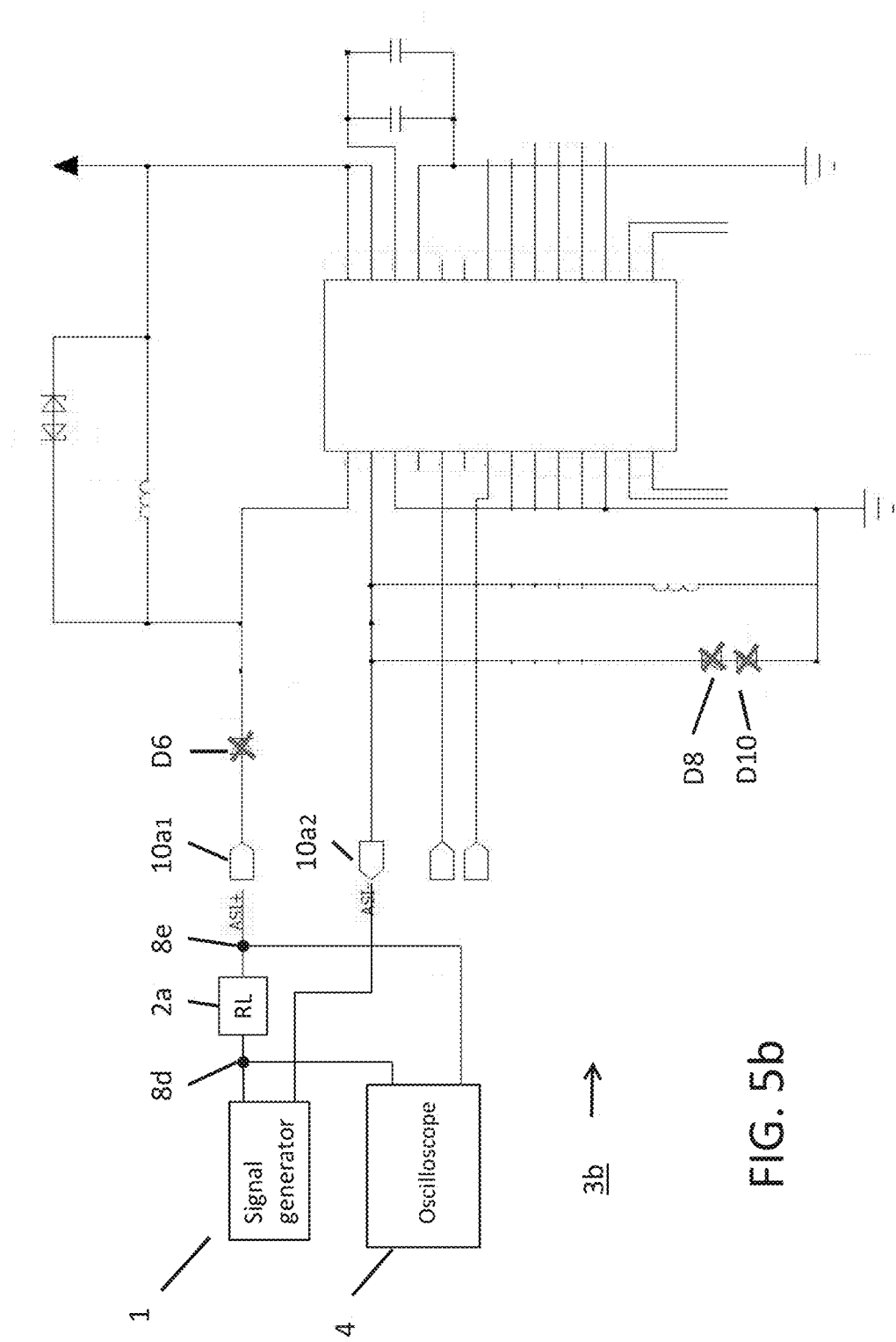
FIG. 5b illustrates the disclosed method implemented for testing a power supply section of a control unit under test with a first fault introduced.

FIG. 5b illustrates the method implemented for testing a power supply section of a control unit to be tested. This power supply section is a control unit $3b$ under test, the power supply section intended to be compared to that of FIG. 5a.

A technical effect of the disclosed method was tested by introducing a first fault in the power supply section of FIG. 5a resulting in a power supply section of FIG. 5b. The fault was introduced by opening the diodes D6, D8 and D9 meaning that they do not exist in the unit to be tested why the circuit is open in that place.

In FIG. 5b, the signal generator 1 is connected to the unit to be tested at connectors $10b_1$ and $10b_2$ correspondingly as in FIG. 5a and an oscilloscope 4 is connected to the measurement points $8h$ and $8i$ as in FIG. 5a.

Depending on whether the first embodiment or the second embodiment of the method is performed, the signal generator 1 and the oscilloscope 4 can other be connected to the units of FIGS. 5a and 5b simultaneously as in FIG. 1 or one at a time for testing as indicated by FIG. 2.

Figure 6A:
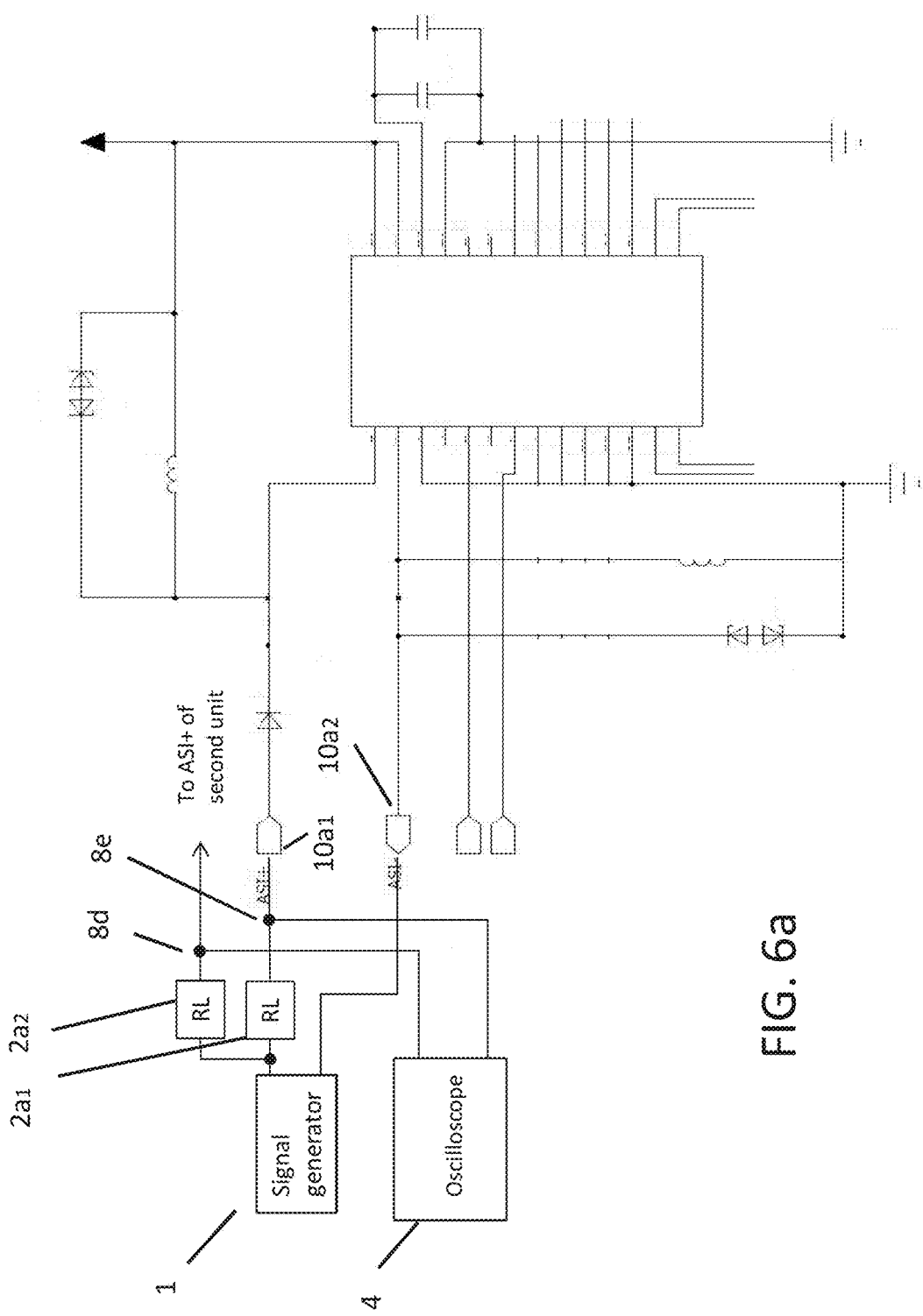
FIG. 6a illustrates the disclosed method implemented for testing two good control units.
Figure 7A:
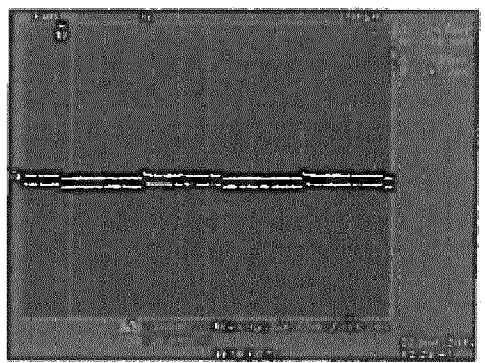
FIGS. 7a-7b shows images of resulting signal shapes from two working units according to FIG. 6a at two different frequencies.
Figure 7B:
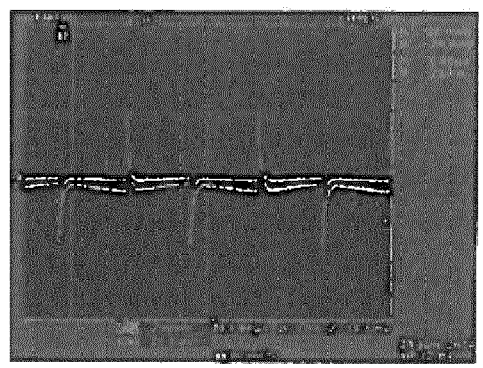

Each of FIGS. 7a-7b show an image of measured signal shapes from two working units both corresponding to the circuit board of FIG. 6a. The images are presented in the form of graphs with the voltage as the x-axis and the time as the y-axis. The input signal was 1 Vpp square wave in both cases.

For achieving the results of FIGS. 7a-7b, the signal generator 1 and the oscilloscope 4 were simultaneously connected to two working units of FIG. 6a. For illustrative reasons, only one is shown since the units are identical. Reference number $2a_1$ is for the resistor in the first working unit shown in FIG. 6a, while reference number $2a_2$ is for the other working unit indicated in FIG. 6a. The good unit in FIG. 6a has two test points, i.e. $10a_1$ and $10a_2$.

In FIG. 7a, the resulting signal shapes of the two working units were measured at a frequency of 5.7 kHz and in FIG. 7b the resulting signal shapes of the two working units were measured at a frequency of 278 kHz. The resulting signal shapes of the two working units were mutually equal at both measured frequencies.

Figure 6B:
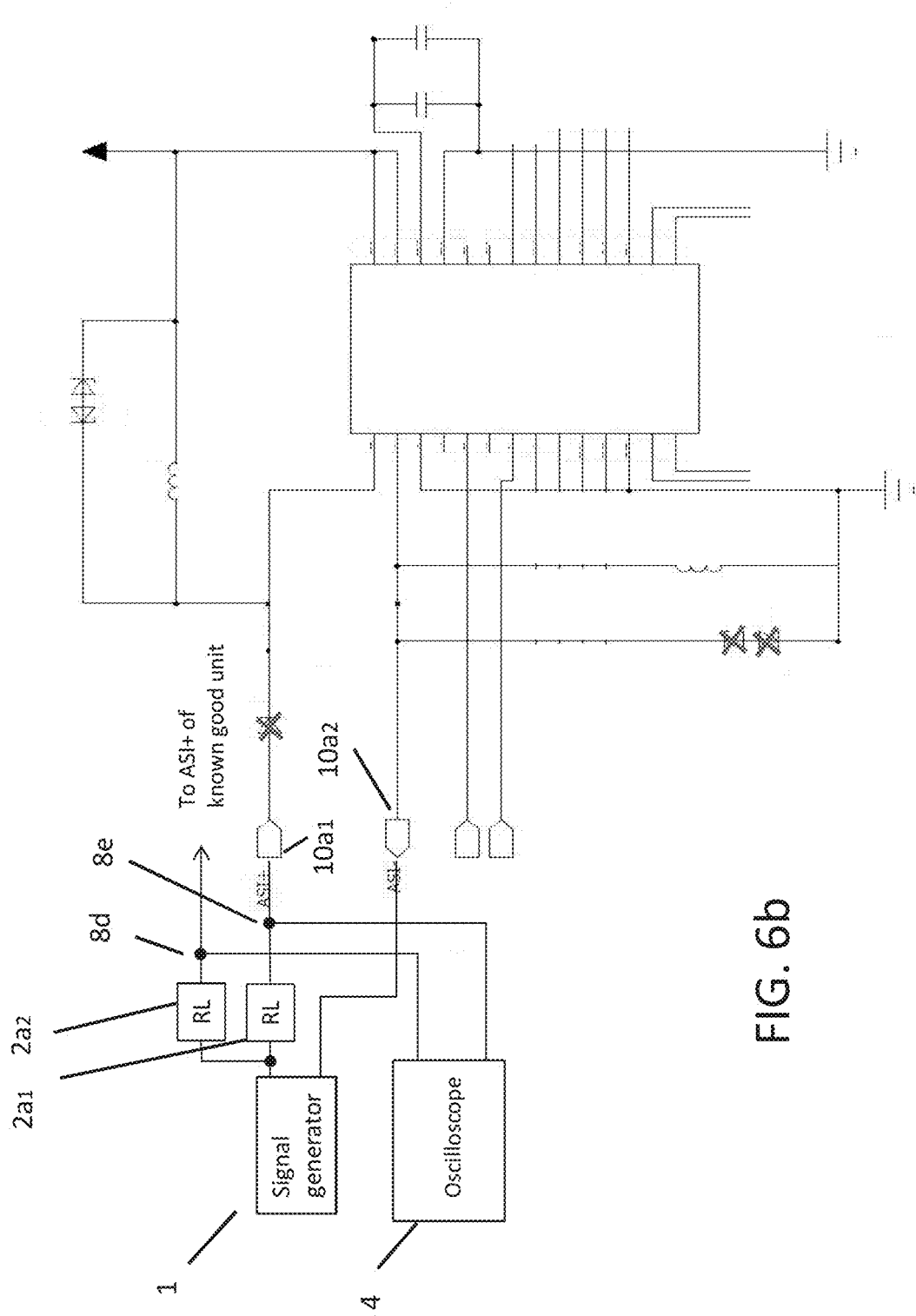
FIG. 6b illustrates the disclosed method implemented for testing a good control unit and a unit under test with a second fault introduced.
Figure 8A:
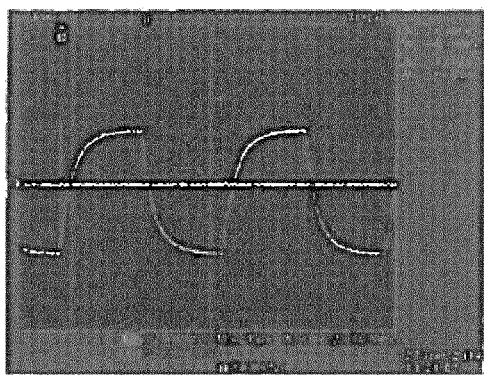
FIGS. 8a-8b shows images of resulting signal shapes from the units according to FIG. 6b at two different frequencies.
Figure 8B:
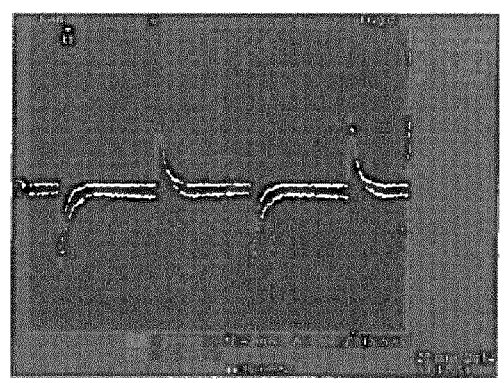

For achieving the results of FIGS. 8a-8b, the signal generator 1 and the oscilloscope 4 were simultaneously connected to a working unit part of FIG. 6a and a unit under test of FIG. 6b in accordance with the principle of FIG. 1. The unit under test in FIG. 6a has two test points, i.e. $10b_1$ and $10b_2$.

Each of FIGS. 8a-8b show an image of measured signal shapes from two units, one shape from the good unit and the other from the unit to be tested corresponding to the unit of FIG. 6b. The images are presented in the form of graphs with the voltage as the x-axis and the time as the y-axis. The input signal was 1 Vpp square wave in both cases.

In FIG. 8a, the resulting signal shapes of the working unit and the unit to be tested corresponding to the unit circuit board of FIG. 6b were measured at a frequency of 12 kHz. The horizontal linear signal shape represents the result of the good unit and the other one represents the result of the unit to be tested. A deviation in measured signal shapes can be seen, the higher signal amplitude being within the faulty unit. The deviation is a result of the introduced fault of the open diodes in FIG. 6b and the shape of the deviating signal shape is unique for this particular fault.

In FIG. 8b the resulting signal shapes of the working unit and the unit to be tested corresponding to the unit of FIG. 6b were measured at a frequency of 278 kHz. The resulting signal shapes of these two units were, however, mutually equal at this measured frequency despite the introduced fault of the open diodes.

The above variation at measured signals is the result of frequency dependent behavior in the unit to be tested. When circuit topology changes, its frequency behavior also changes but this can happen in a limited frequency area only as can be seen above.

For fault detection, the testing therefore should take place over a sufficient frequency range that can be pre-determined in advance.

Figure 9:
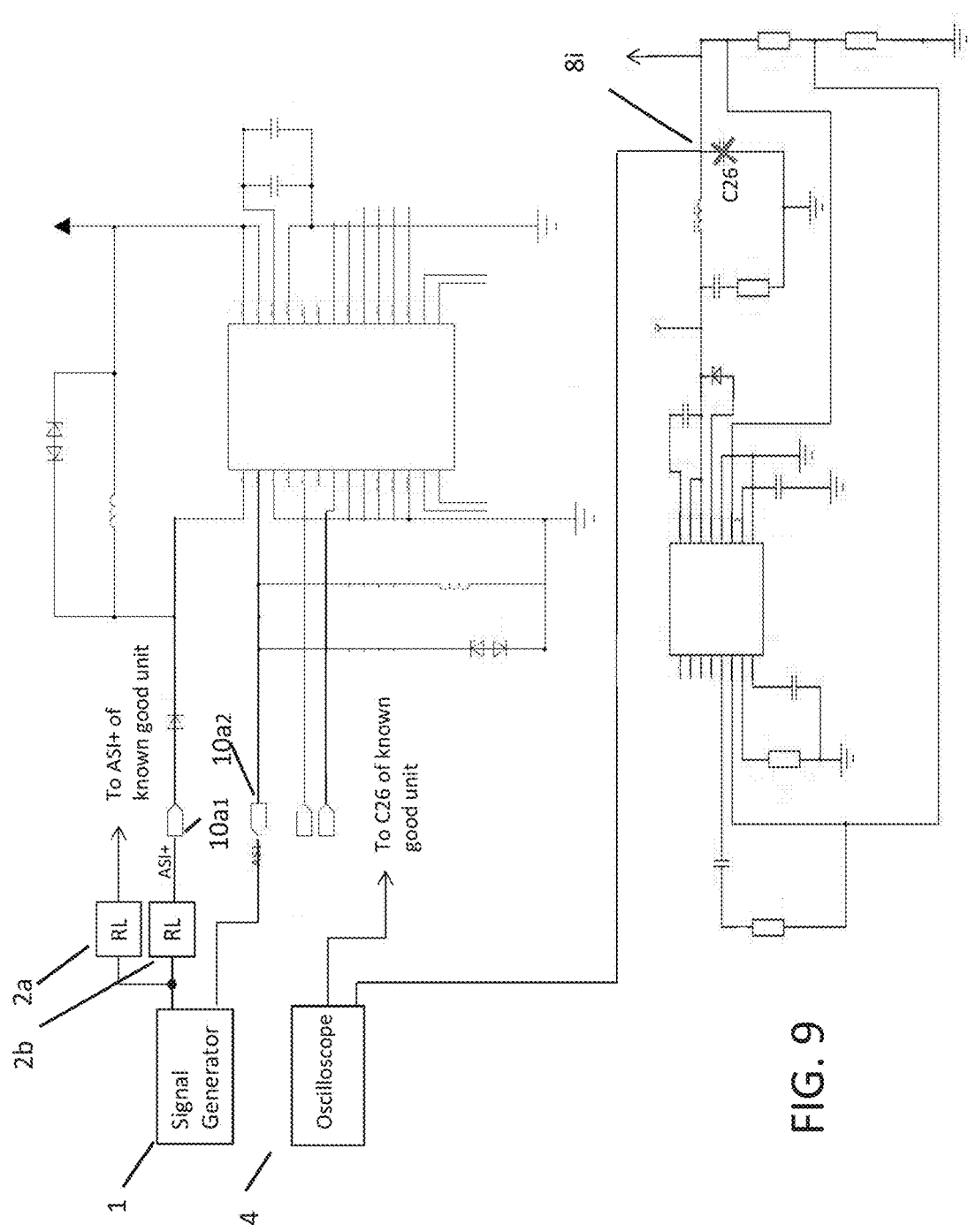
FIG. 9 illustrates the disclosed method implemented for testing a power supply section of a control unit under test with a third fault introduced.
Figure 10:
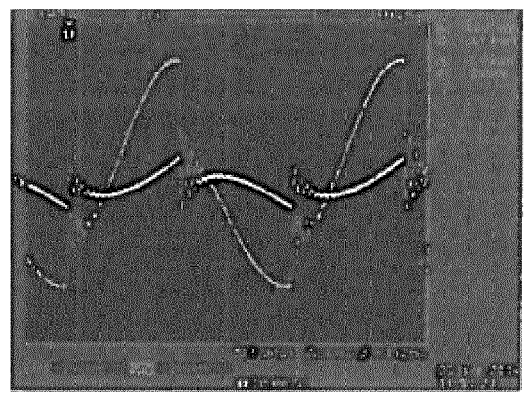
FIG. 10 shows images of resulting signal shapes from the unit according to FIG. 9 at one frequency.

Resulting measured signals vary from case to case. As another example FIGS. 9-10 are presented for testing the same power supply section of a unit under test with the capacitor C6 open. In this case, a measurement is done from a test point $8i$ next to C6.

FIG. 9 shows a power supply section of a control unit $3b$ under test, the power supply section intended to be compared to that of FIG. 5a (except that the measurement point is on another place).

A technical effect of the disclosed method was tested by introducing a fault in the power supply section of a corresponding good unit of FIG. 6a resulting in a power supply section of FIG. 9. (The faults introduced in FIG. 7 was called "the first fault"). This second fault was introduced by opening the capacitor C26 meaning that it does not exist in the unit to be tested why the circuit is open in that place.

In FIG. 9, the signal generator 1 is connected to the unit to be tested at connectors $10b_1$ and $10b_2$ as in FIG. 6a and an oscilloscope 4 is connected to a measurement point $8i$.

For achieving the result of FIG. 10, the signal generator 1 and the oscilloscope 4 were simultaneously connected to 1) a working unit otherwise corresponding to FIG. 5 but connecting the measurement point corresponding to that of FIG. 9 and 2) a unit under test of FIG. 9 in accordance with the principle of FIG. 1.

FIG. 10 shows an image of measured signal shapes from two units, one shape from the good unit and the other from the unit to be tested corresponding to the unit of FIG. 9. The image is presented in the form of graphs with the voltage as the x-axis and the time as the y-axis. The input signal was a 1 Vpp square wave.

In testing the unit of FIG. 9, the resulting signal shapes of the working unit and the unit to be tested were measured throughout the frequency range of 1 Hz-1 MHz, the testing showing the largest deviation at a frequency of 178 kHz. The deviating signal shape at this frequency of 178 kHz is presented in FIG. 10.

The signal shape with the higher signal amplitude being within the faulty unit of FIG. 9 and the other signal shape representing the result of the good unit. The deviation is a result of the introduced fault of the open capacitor and the shape of the deviating signal shape is unique for this particular fault.

For fault detection, the testing can take place over a sufficient frequency range in one case pre-determined in advance so that the most accurate result could be obtained.

Figure 11A:
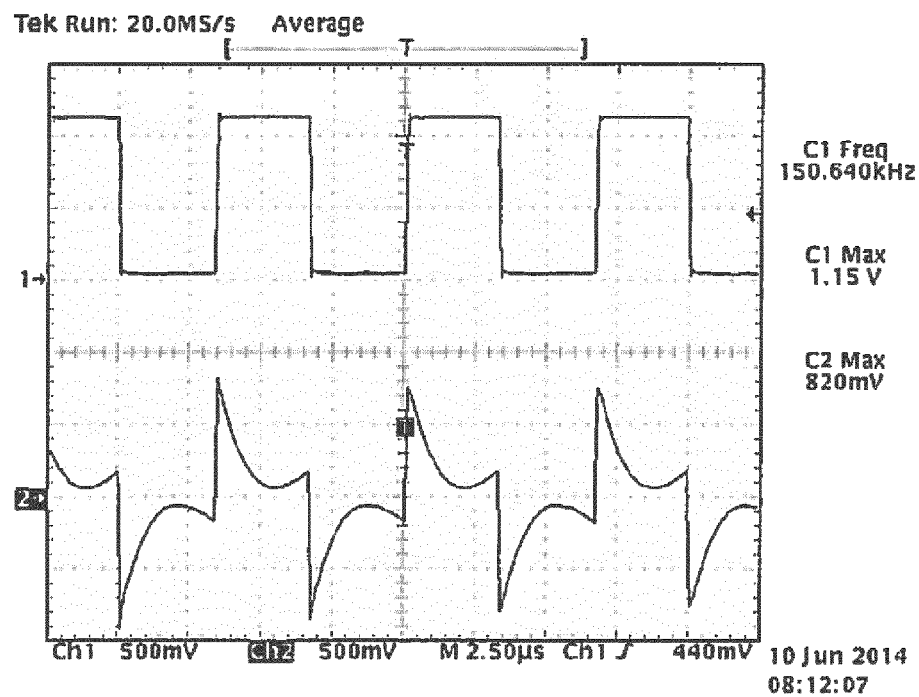
FIGS. 11a-11b shows graphical images of input and resulting signal shapes from a known good unit of FIG. 5a and from a unit of FIG. 5b with a diode failure, respectively, when using a square wave as input signal.
Figure 11B:
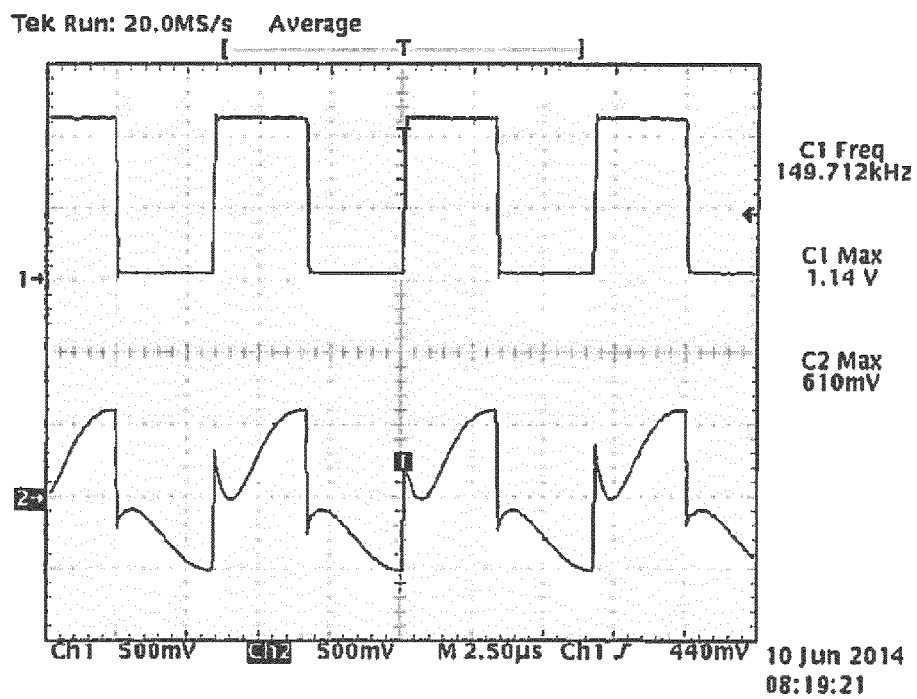

For achieving the results of FIGS. 11a-11b, the signal generator 1 and the oscilloscope 4 were first connected to a working unit of FIG. 5a and after measurement to a unit under test of FIG. 5b in accordance with the principle of FIG. 2. For comparing the results of both units, the received signal shapes were fetched from a database, wherein they were stored.

FIG. 11a shows test results of a good unit according to FIG. 5 with a different presentation calculated by software in the measuring instrument.

FIG. 11a shows an image of two signal shapes at a frequency of 150, 640 kHz in the form of graphs with the voltage as the x-axis and the time as the y-axis. The upper one represents the input signal of the known good unit of FIG. 5, the signal shape of the input signal being a square wave of 1 Vpp. The lower one is the resulting signal shape from this good unit.

FIG. 11b shows a corresponding image of two signal shapes at almost the same frequency of 149, 712 kHz for a similar unit to be tested according to FIG. 5b with a diode failure, the signal shape of the input signal being a square wave of 1 Vpp. The upper one represents the input signal to the unit under test being the same square wave as in FIG. 11a. The lower one is the resulting signal shape from the unit under test of FIG. 5b.

When the lower signal shapes in the graphs of the images of FIGS. 11a and 11b are compared, it can be seen, even with the naked eye, that they deviate from each other indicating a diode failure in the unit under test.

Figure 12A:
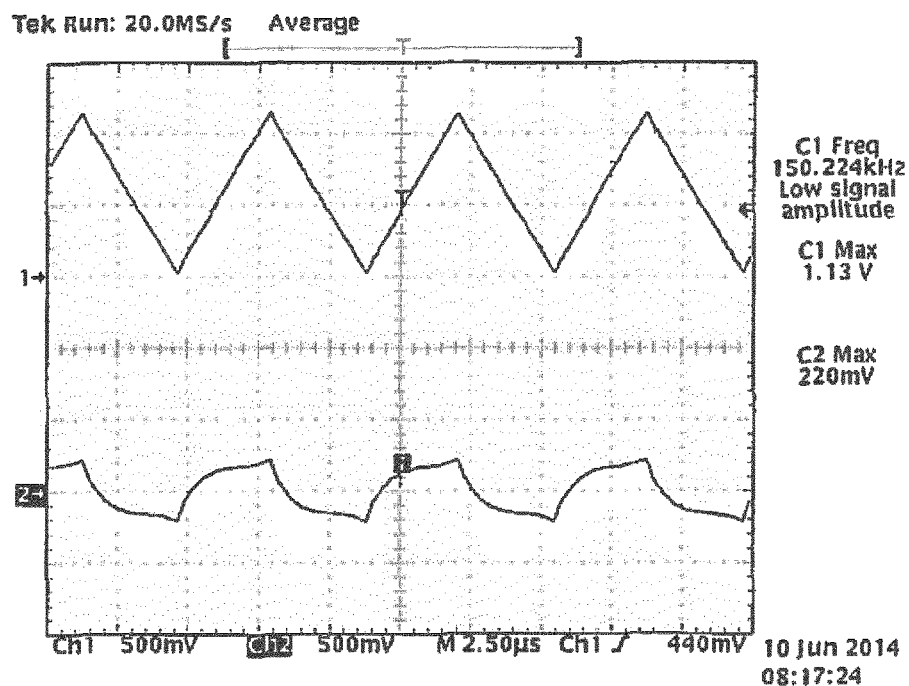
FIGS. 12a-12b shows images of input and resulting signal shapes from a known good unit of FIG. 5 and from a unit of FIG. 7 with a diode failure, respectively, when using a triangle wave as input signal.

FIG. 12a shows an image of two signal shapes at a frequency of 150, 224 kHz in the form of graphs with the voltage as the x-axis and the time as the y-axis. The upper one represents the input signal of the known good unit of FIG. 5, the signal shape of the input signal being a triangle wave of 1 Vpp. The lower one is the resulting signal shape from this good unit.

Figure 12B:
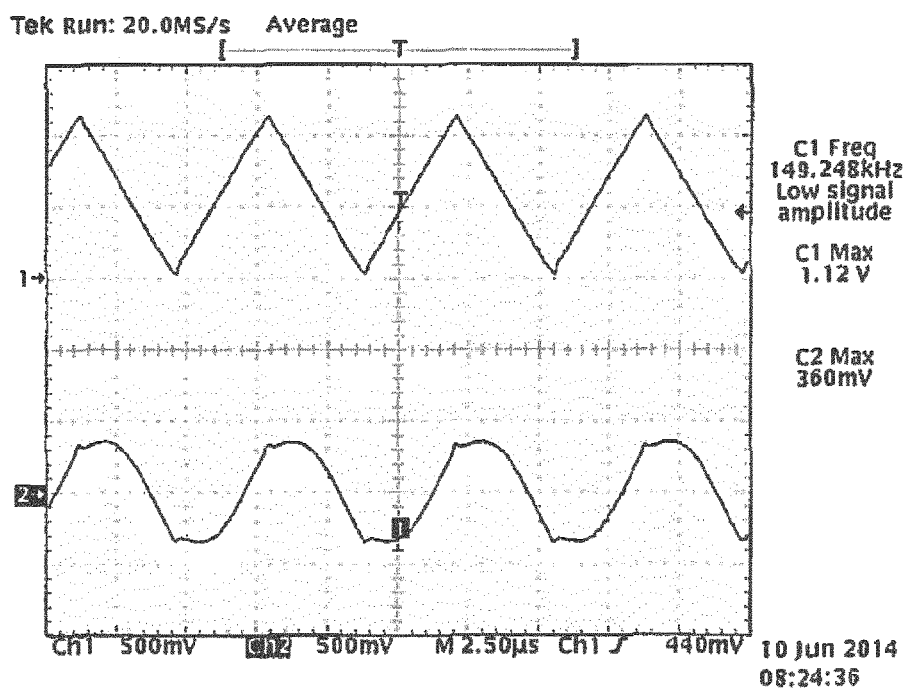

FIG. 12b shows a corresponding image of two signal shapes at almost the same frequency of 149, 248 kHz for a similar unit to be tested according to FIG. 5b with a diode failure, the signal shape of the input signal being a triangle wave of 1 Vpp. The upper one represents the input signal to the unit under test being the same triangle wave as in FIG. 12a. The lower one is the resulting signal shape from the unit under test of FIG. 5b.

When the lower signal shapes in the graphs of the images of FIGS. 12a and 12b are compared, it can be seen, even with the naked eye, that they deviate from each other indicating a diode failure in the unit under test.

Figure 13:
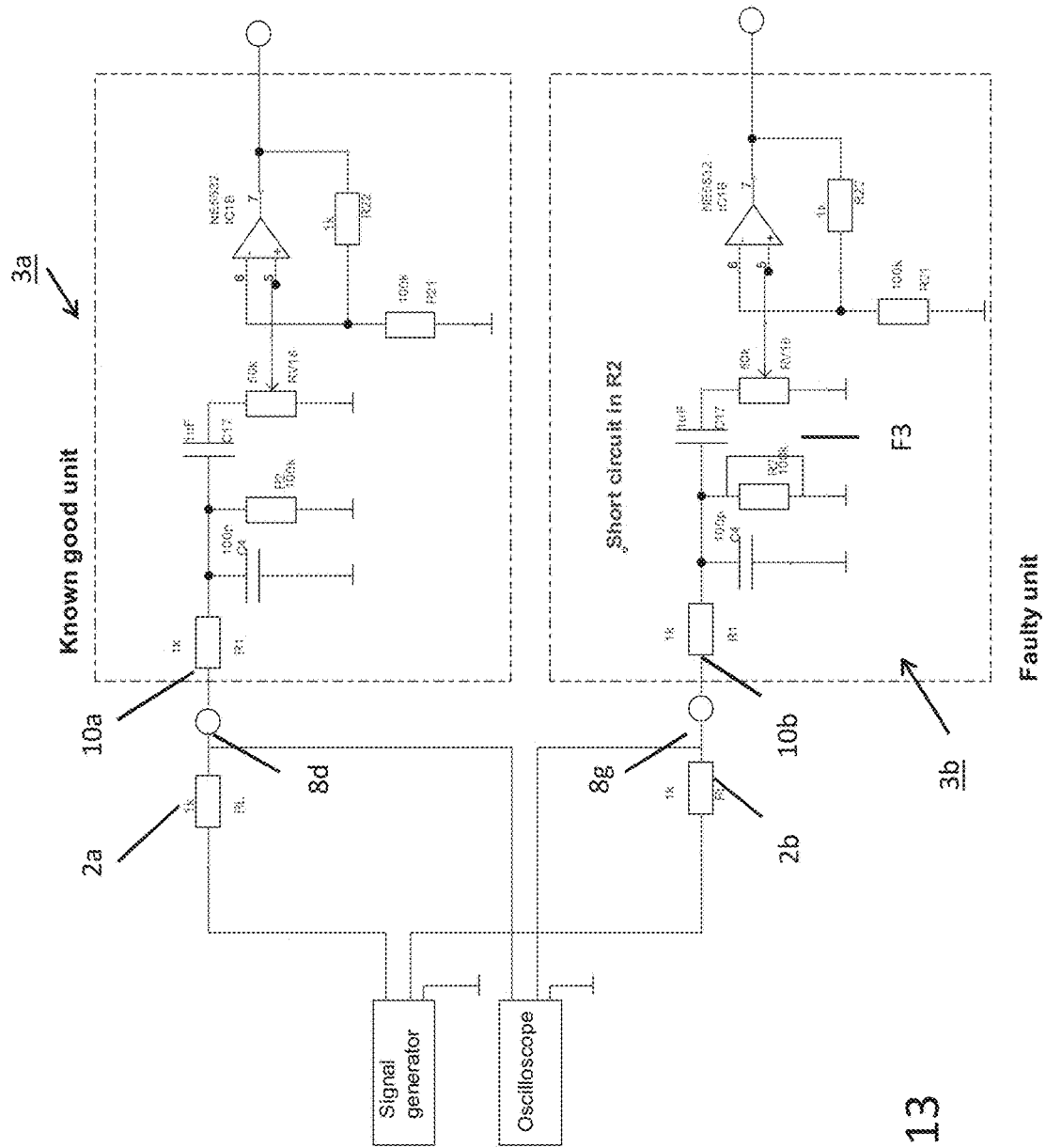
FIG. 13 illustrates the disclosed method implemented for simultaneous testing of a good unit and a control unit under test corresponding to the good unit but with a fourth fault introduced.

FIG. 13 illustrates the method implemented for simultaneous testing of an audio preamplifier of a good unit and unit under test corresponding to the good unit but with a fourth fault introduced. The fault F3 introduced is a short cut of resistance R2 compared to the good unit above.

In FIG. 13, the signal generator 1 is connected to the unit 3b to be tested at connector 10b and to connector 10a of the good unit 3a. An oscilloscope 4 is connected to a measurement point 8d of the good unit 3a and to measurement point 8g of the unit under test.

Figure 14:
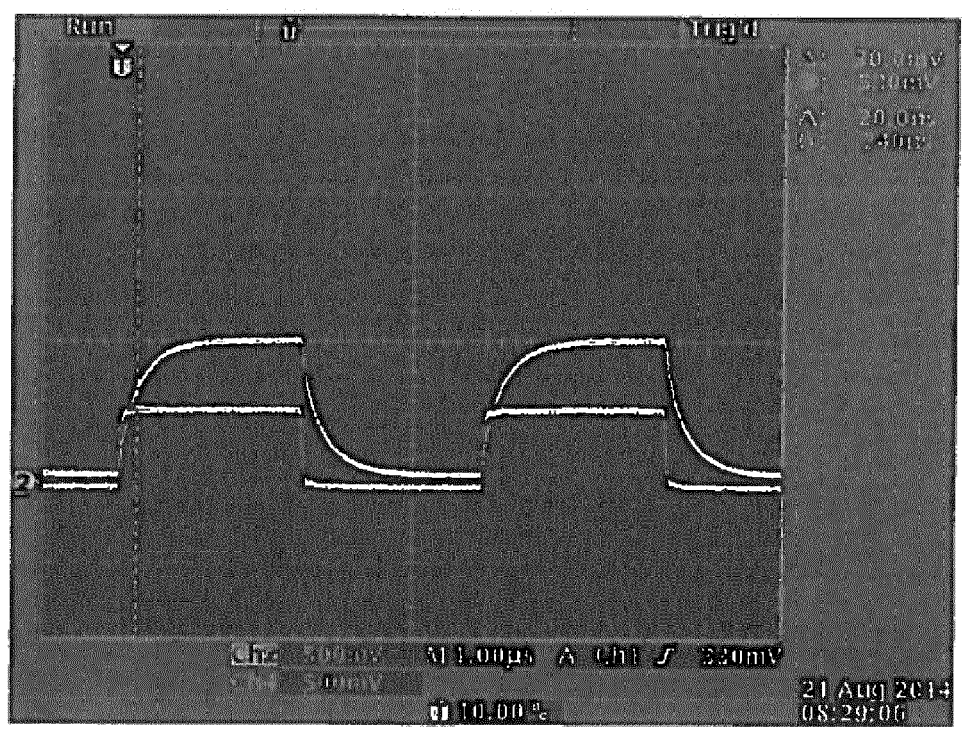
FIG. 14 shows images of resulting signal shapes from the known good unit and from the unit under test both included in FIG. 13.

FIG. 14 shows images of resulting signal shapes from the known good unit and from the unit under test both included in FIG. 13.

FIG. 14 shows an image of measured signal shapes from two units, one shape from the good unit and the other from the unit to be tested corresponding to the unit of FIG. 13. The image is presented in the form of graphs with the voltage as the x-axis and the time as the y-axis. The input signal was a 1 Vpp square wave.

In testing the unit under test 3b included in FIG. 13, the resulting signal shapes of the working unit and the unit to be tested were measured and FIG. 14 showing the results at a frequency of 202 Hz.

The deviating signal shape of the unit under test can be clearly seen. The signal shape with the lower signal amplitude being within the faulty unit and the other signal shape representing the result of the good unit. The deviation is a result of the introduced fault of the short cut in the resistor R2 and the shape of the deviating signal shape is unique for this particular fault.

Having described the invention in detail and by reference to certain embodiments, it will be apparent that modifications and variations thereof are possible without departing from the scope of the invention.

What is claimed is:

1. A method of testing an electronic unit by comparing resulting signal shapes from the unit to be tested and a known functioning unit, the signal shapes from both units being compared by means of the frequency response of the electronic unit, the method including:
    a) powering off the units for testing,
    b) feeding one or more predefined signal shapes of two or more different frequencies as input signals to the known functioning unit and to the unit to be tested at corresponding test points,
    c) measuring the resulting signal shapes from both units at corresponding measurement points,
    d) comparing at least one resulting signal shape from the known functioning unit with the corresponding resulting signal shape from the unit to be tested, and
    e) detecting a fault in the unit to be tested on the basis of an existing signal shape distortion in time axis of the resulting signal shape received from the unit to be tested.

2. The method of claim 1 wherein the method is performed over a frequency range.

3. The method of claim 1 wherein the waveform of the input signal is a positive square form, a triangle wave form, or an arbitrary wave form.

4. The method of claim 1 wherein step a) is performed for one or more corresponding test points and/or measurement points on both units.

5. The method of claim 1 wherein the resulting signal shapes from both units are measured as the voltage variation in time.

6. The method of claim 1 wherein step b) is performed by feeding the input signals in two separate phases to the known functioning unit and to the unit under test.

7. The method of claim 1 wherein step b) is performed by feeding the input signals simultaneously to and measuring the resulting signal shapes simultaneously from the known functioning unit and to the unit under test, whereby step d) and step e) performed constantly during the testing.

8. The method of claim 1 wherein the measured signal shape from each measurement point from the functioning unit is stored as a reference shape to constitute the signal signature of the functioning unit.

9. The method of claim 1 wherein the measured signal shape from each measurement point from the unit under test is stored as a resulting signal shape to constitute the signal signature of the unit under test.

10. The method of claim 1 wherein the signal signatures are stored as functions of the voltage variation in time of the feed-back signals.

11. The method of claim 1 wherein the signal signatures are presented simultaneously or separately on a user interface as graphs with the voltage as the y-axis and the time as the x-axis.

12. The method of claim 1 wherein the comparison of step d) is performed automatically by software calculation or by manual image analysis.

13. The method of claim 1 further including localizing the detected fault by comparing the waveform of the resulting signal shape at a given number of measuring points.

14. The method of claim 1 wherein the feeding and measuring steps are carried out while the units are powered off.

15. A system for testing an electronic unit, comprising
a) at least one electronic functioning unit,
b) at least one electronic unit under test being comprised in the system simultaneously or interchangeably with the electronic functioning unit,
c) a signal generator connectable to the electronic units, the signal generator being configured to create one or more signals with pre-defined signal shapes of varying frequencies and to feed the created signals as input signals to the electronic functioning unit and simultaneously or separately to the electronic unit under test, and
d) a measurement instrument connectable to the electronic units, the measurement instrument being configured to:
receive at least one resulting signal shape simultaneously or separately from the electronic functioning unit and from the electronic unit under test,
transform said at least one resulting signal shape into discrete values that describe the signal shape, and
present information of said at least one resulting signal shape.

16. The system of claim 15, further including a data processing unit in the measurement instrument with software for:
comparing, at least one resulting signal shape from the functioning unit with the corresponding resulting signal shape from the unit to be tested, and
detecting a fault in the unit to be tested on the basis of an existing signal shape distortion of the resulting signal shape received from the unit to be tested.

17. The system of claim 15 wherein the measurement instrument is connected to or comprises a display and has software for presenting information of the resulting signal shapes of both units simultaneously or separately on the display on the measuring instrument.

18. The system of claim 15 further including a memory database for storing the resulting signal shapes in the memory database by means of the processing unit fetching data of resulting signal shapes from the electronic units from the memory database for the comparison.

19. The system of claim 15 wherein the software further has an algorithm for said fault detection that compares resulting signal shapes from an electronic unit under test and an electronic functioning unit and analyzes the difference to detect said signal shape distortion.

20. The system of claim 15 wherein the signal generator is configured to create different waveforms including square or triangle waveforms.

21. A computer program product, which, when run from a non-transitory computer readable media, executes, in a system comprising at least one electronic functioning unit, at least one electronic unit under test, a signal generator and a measuring instrument both connectable to the electronic units, said electronic units being connected simultaneously or interchangeably to the measurement instrument, wherein the signal generator is configured to create one or more signals with pre-defined signal shapes of varying frequencies and to feed the created signals as input signals to said electronic units, the following steps of:
comparing, at least one resulting signal shape from the functioning unit with the corresponding resulting signal shape from the unit to be tested, and
detecting a fault in the unit to be tested on the basis of an existing signal shape distortion of the resulting signal shape received from the unit to be tested.

* * * * *